US012745029B2

(12) United States Patent
Gleason et al.

(10) Patent No.: US 12,745,029 B2
(45) Date of Patent: Sep. 22, 2026

(54) ELECTROMAGNETIC SHIELDING FOR MICROPHONE

(71) Applicant: Shure Acquisition Holdings, Inc., Niles, IL (US)

(72) Inventors: Bryan Gleason, Chicago, IL (US); Brian Mroozian, Chicago, IL (US); Zhonglin Liu, Suzhou (CN); Weijun Tang, Suzhou (CN); Weiqiang Kang, Suzhou (CN)

(73) Assignee: Shure Acquisition Holdings, Inc., Niles, IL (US)

( * ) Notice: Subject to any disclaimer, the term of this patent is extended or adjusted under 35 U.S.C. 154(b) by 211 days.

(21) Appl. No.: 18/646,683

(22) Filed: Apr. 25, 2024

(65) Prior Publication Data

US 2025/0338050 A1 Oct. 30, 2025

(51) Int. Cl.
*H04R 25/00* (2006.01)
*H04R 1/04* (2006.01)
*H05K 9/00* (2006.01)

(52) U.S. Cl.
CPC ............. *H04R 1/04* (2013.01); *H05K 9/0016* (2013.01); *H05K 9/002* (2013.01); *H05K 9/0049* (2013.01); *H05K 9/009* (2013.01)

(58) Field of Classification Search
CPC ........ H04R 1/04; H05K 9/0016; H05K 9/002; H05K 9/0049; H05K 9/009
USPC ........................................ 381/189, 355, 190
See application file for complete search history.

(56) References Cited

U.S. PATENT DOCUMENTS 5,970,159 A * 10/1999 McIntosh ................. H04R 1/04 381/357
6,310,961 B1 * 10/2001 Oliveira .................. A61F 11/08 381/328
7,168,965 B2 * 1/2007 Akino .................... H04R 19/04 439/95
8,014,546 B2 * 9/2011 Lurvink ................. H04R 19/04 381/189
8,340,735 B2 * 12/2012 Edeler .................... H05K 9/002 455/575.8
11,889,670 B2 * 1/2024 Meeusen ................ H04R 1/021
12,563,327 B2 * 2/2026 Meeusen ................ H04R 1/021
2012/0034959 A1 * 2/2012 Edeler ................... H04M 1/026 455/575.5
2015/0319526 A1 * 11/2015 Kunimoto ................ H04R 1/10 381/74
2018/0220215 A1 * 8/2018 Meyer ...................... H04R 1/08
2019/0346057 A1 * 11/2019 Verrecchia ............ F16K 31/082

* cited by examiner

*Primary Examiner* — William J Deane, Jr.
(74) *Attorney, Agent, or Firm* — Banner & Witcoff, Ltd.

(57) ABSTRACT

An audio device, such as a microphone, may include a shield adapted to shield one or more components of the audio device from electromagnetic interference (EMI). The shield may be a metallic mesh structure that allows for audio to be processed through the shield while blocking electromagnetic radiation, such as radio-frequency (RF) electromagnetic radiation from RF transmissions from one or more wireless devices. The microphone may be adapted to engage and secure the shield with one or more components of the audio device (e.g., the housing). This advantageously improves the audio quality and performance by blocking or suppressing the electromagnetic radiation and resulting EMI.

20 Claims, 13 Drawing Sheets

205
206
202
203
208
201
204
210
110
214
209
215
112
212
216
217
213
218
219
220
102
104.2
106
108
103
228
207
230

205
206
304
305
202
203
204
208
102
210
110
214
215
112
209
212
216
217
213
218
219
220
230
104.2
106
108
103
228
207

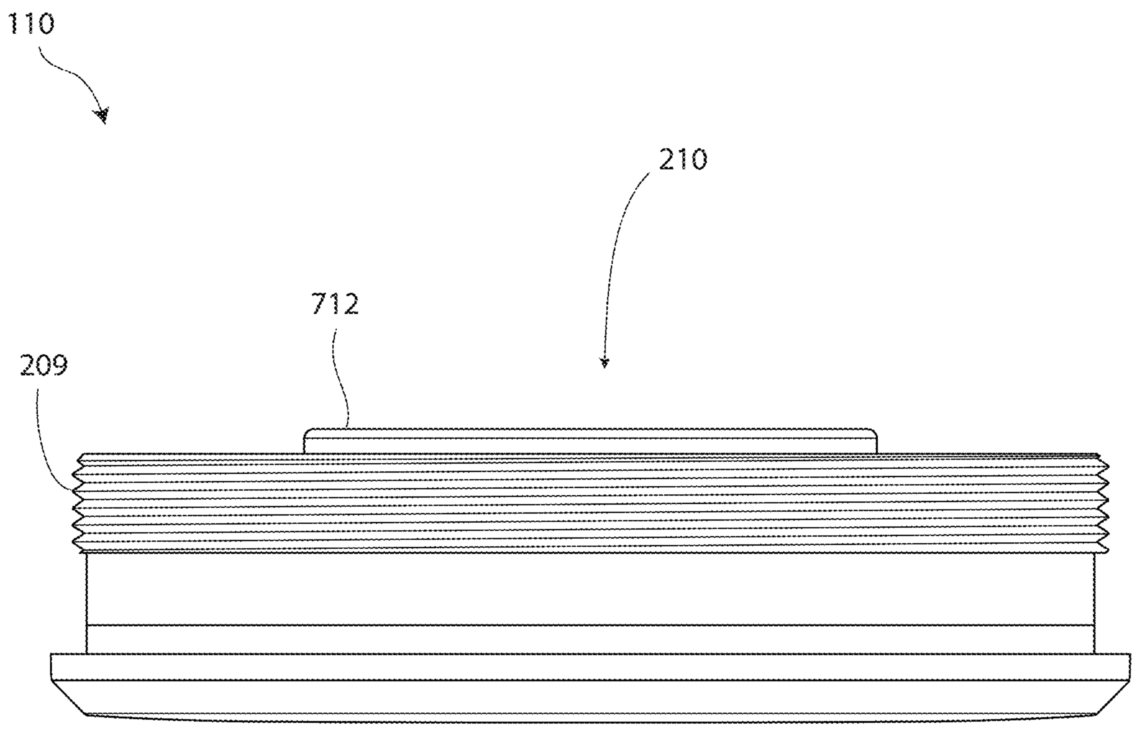
FIG. 14
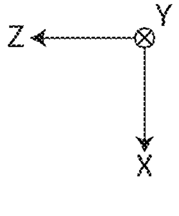

ELECTROMAGNETIC SHIELDING FOR MICROPHONE

TECHNICAL FIELD

Aspects of the disclosure relate to electromagnetic shielding for electronic devices (e.g., microphones), and more specifically to woven mesh shielding within a microphone housing and enclosing a transducer.

BACKGROUND

Microphones convert sound into an electrical signal through the use of a transducer that includes a diaphragm to convert sound into mechanical motion, which in turn is converted to an electrical signal. Generally, microphones can be categorized by their transducer method (e.g., condenser, dynamic, ribbon, carbon, laser, or microelectromechanical systems (MEMS)).

The performance of a microphone may be impacted by electromagnetic interference (EMI) caused by electromagnetic radiation (e.g., electrical and/or electromagnetic fields) from low-frequency energy sources (e.g., 50 or 60 Hz AC power noise) and/or from high-frequency energy sources (e.g., radio-frequency (RF) components producing RF energy). The EMI may be generated by external and/or internal energy sources. Microphone housings in current techniques include gaps between housing portions, such as between the interface of solid and grill portions of the microphone housing. These gaps allow for electromagnetic radiation to enter the interior of the housing and negatively impact the operation of the microphone transducer.

SUMMARY

Aspects of the disclosure provide effective and reliable technical solutions that address and overcome problems associated with operation of electronic devices, such as microphones, in electromagnetic environments by providing shielding solutions for improved performance of the microphones, including radio-frequency (RF) shielding solutions for improved performance in RF environments.

A microphone may include any type of microphone, such as but not limited to, a unidirectional microphone, a multi-directional microphone, an omnidirectional microphone, a dynamic microphone, a cardioid dynamic microphone, or a condenser microphone. The microphone may include the functionality for wireless communications, and/or be configured to interface with a communication module configured for wireless communications. In other aspects, the microphone may have a wired connection with an audio receiver. The shielding solutions according to aspects of the disclosure provide improved shielding performance from electromagnetic radiation from external energy sources, such as external wireless communication devices, and/or from internal components of the microphone's internal circuitry. Configurations described herein advantageously improve the audio quality and performance of the microphone.

BRIEF DESCRIPTION OF THE DRAWINGS

The present disclosure is illustrated by way of example and not limited in the accompanying figures in which like reference numerals indicate similar elements and in which:

FIG. 14 is a side view of the retainer of FIG. 13 according to one or more exemplary embodiments.

DETAILED DESCRIPTION

In the following description of various illustrative embodiments, reference is made to the accompanying drawings, which form a part hereof, and in which is shown, by way of illustration, various embodiments in which aspects of the disclosure may be practiced. It is to be understood that other embodiments may be utilized, and structural and functional modifications may be made, without departing from the scope of the present disclosure. It is noted that various connections between elements are discussed in the following description. It is noted that these connections are general and, unless specified otherwise, may be direct or indirect, wired or wireless, and that the specification is not intended to be limiting in this respect.

Figure 1:
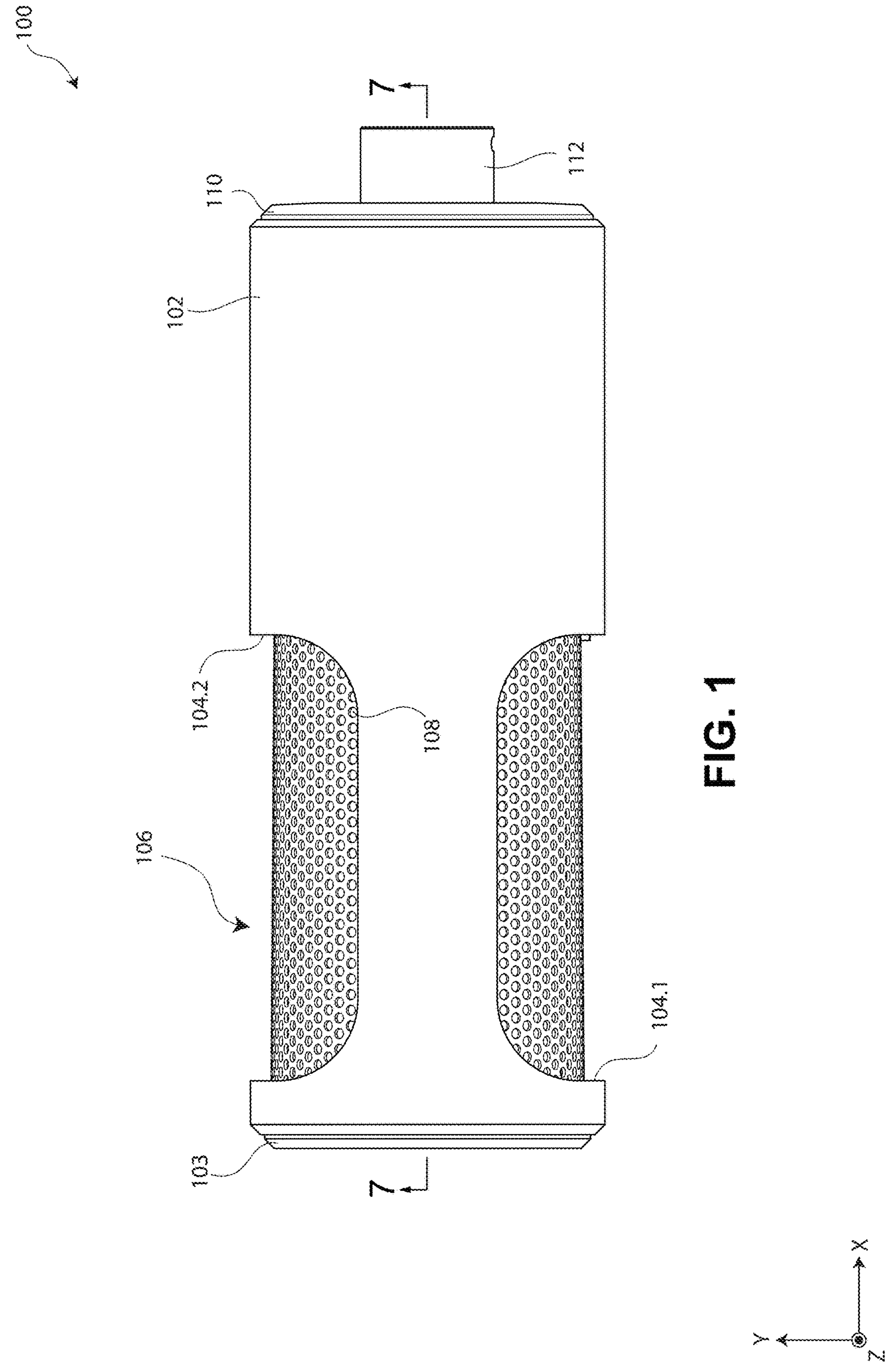
FIG. 1 is a side view of a microphone according to one or more exemplary embodiments.

FIG. 1 is a side view of a microphone 100 according to one or more exemplary embodiments. In context of FIG. 7 to be described further herein, a cross-section of the microphone 100 taken along 7-7 is illustrated. The microphone 100 may have a generally cylindrical shape, but aspects of the disclosure are applicable to other shaped microphones. Further, aspects are not limited to the type of microphone, and are applicable to unidirectional microphones, a multi-directional microphones, omnidirectional microphones, dynamic microphones, cardioid dynamic microphones, condenser microphones, or the like.

The microphone 100 may have a housing 102 having openings 104 (including, e.g., openings 104.1, 104.2). The openings 104 may include grilles 106 having a plurality of apertures 108 adapted to allow sound waves (e.g., acoustic energy) to pass into the interior of the housing 102 and be converted into electrical signals by one or more audio transducers (e.g., cartridge 228 (FIG. 2)). The grille(s) 106 protect the internal components of the microphone 100, such as the cartridge 228 and internal circuitry, and may be further adapted as a windscreen and/or pop filter.

The housing 102 may include a first (top) end enclosed by an endcap 103. The endcap 103 may further include a grille similar to grille(s) 106. The second end of the microphone 100 may include an opening 201 (FIG. 2) that may be selectively closed by a retainer 110. As discussed in more detail below, the retainer 110 may additionally engage input/output (I/O) interface 112 of frame 216 to close off the opening 201. In an exemplary embodiment, the housing 102, retainer 110, and/or the grille(s) 106 may be formed from, for example, zinc or a zinc alloy. In other aspects, the housing 102, retainer 110, and/or the grille(s) 106 may be formed from one or more other metals or metal alloys (e.g., electromagnetically permeable (ferrous) materials, such as steel; aluminum; or an aluminum alloy), and/or one or more other electrically conductive materials. In one or more aspects, the grille(s) 106 may be non-metallic and formed from non-metallic materials, such as plastic.

The I/O interface 112 may include one or more input connections configured to receive input data and/or signals using one or more wired (e.g., audio cables) and/or wireless communication protocols. Additionally, or alternatively, the I/O interface 112 may include one or more output connections configured to transmit output data and/or signals using one or more wired and/or wireless communication protocols.

In an exemplary embodiment, the I/O interface 112 may include a dedicated audio interface 214, such as an XLR connector. The audio interface 214 is not limited to XLR connections and may include other connection interfaces, such as a 3.5 mm connector, a general-purpose interface (e.g., a universal serial bus (USB) connector), an Ethernet connector, or any other type of interface. The I/O interface 112 may be configured to interface with one or more microphone accessories, such as a removable (e.g., plug-in) wireless transceiver module. The I/O interface 112 may be configured to transmit one or more outputs that allow the microphone 100 to output audio signals and/or data. The audio signals and/or data may be output on one or more channels.

The I/O interface 112 is not limited to wired connections and may include a wireless transceiver configured to transmit and/or receive signals using one or more communication protocols, such as, the Bluetooth protocol, an Institution of Electrical and Electronics Engineers (IEEE) 802.11 WIFI protocol, a 3rd Generation Partnership Project (3GPP) cellular protocol, a local area network (LAN) protocol, a hypertext transfer protocol (HTTP), FM radio, infrared, one or more optical protocols, fiber optics, industrial, scientific, and medical (ISM) bands defined by the International Telecommunication Union (ITU) Radio Regulations (e.g., a 2.4 GHz-2.5 GHZ band, a 5.75 GHz-5.875 GHz band, a 24 GHz-24.25 GHz band, and/or a 61 GHz-61.5 GHz band, etc.), a very high frequency (VHF) band (e.g., 30 MHz-300 MHz band) and/or via (e.g., one or more channels within) an ultra-high frequency (UHF) band (e.g., 300 MHz-3 GHZ). The communication protocols that may be used are not limited to these example protocols.

Figure 2:
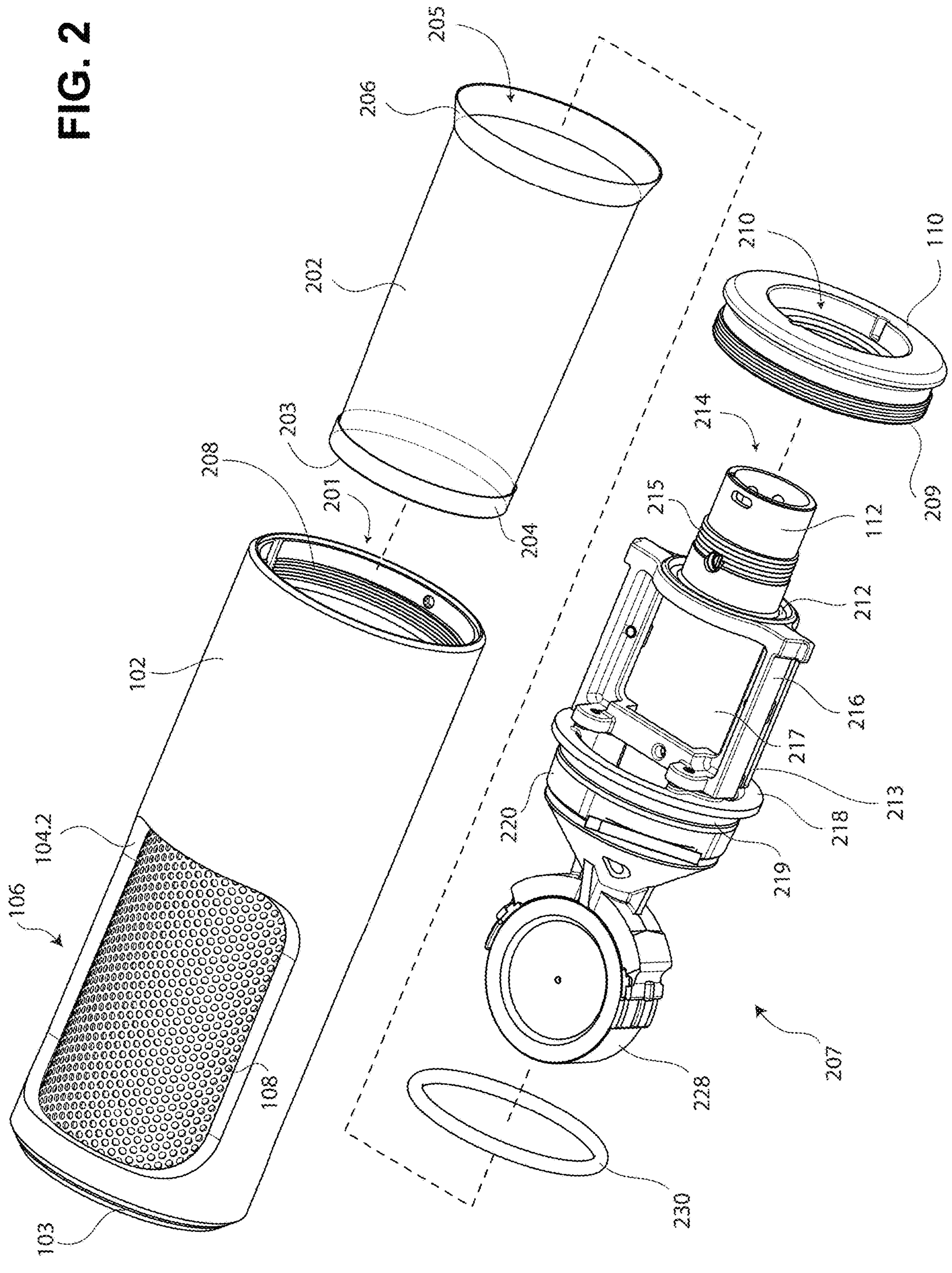
FIG. 2 is an exploded view of the microphone of FIG. 1 according to one or more exemplary embodiments.
Figure 4:
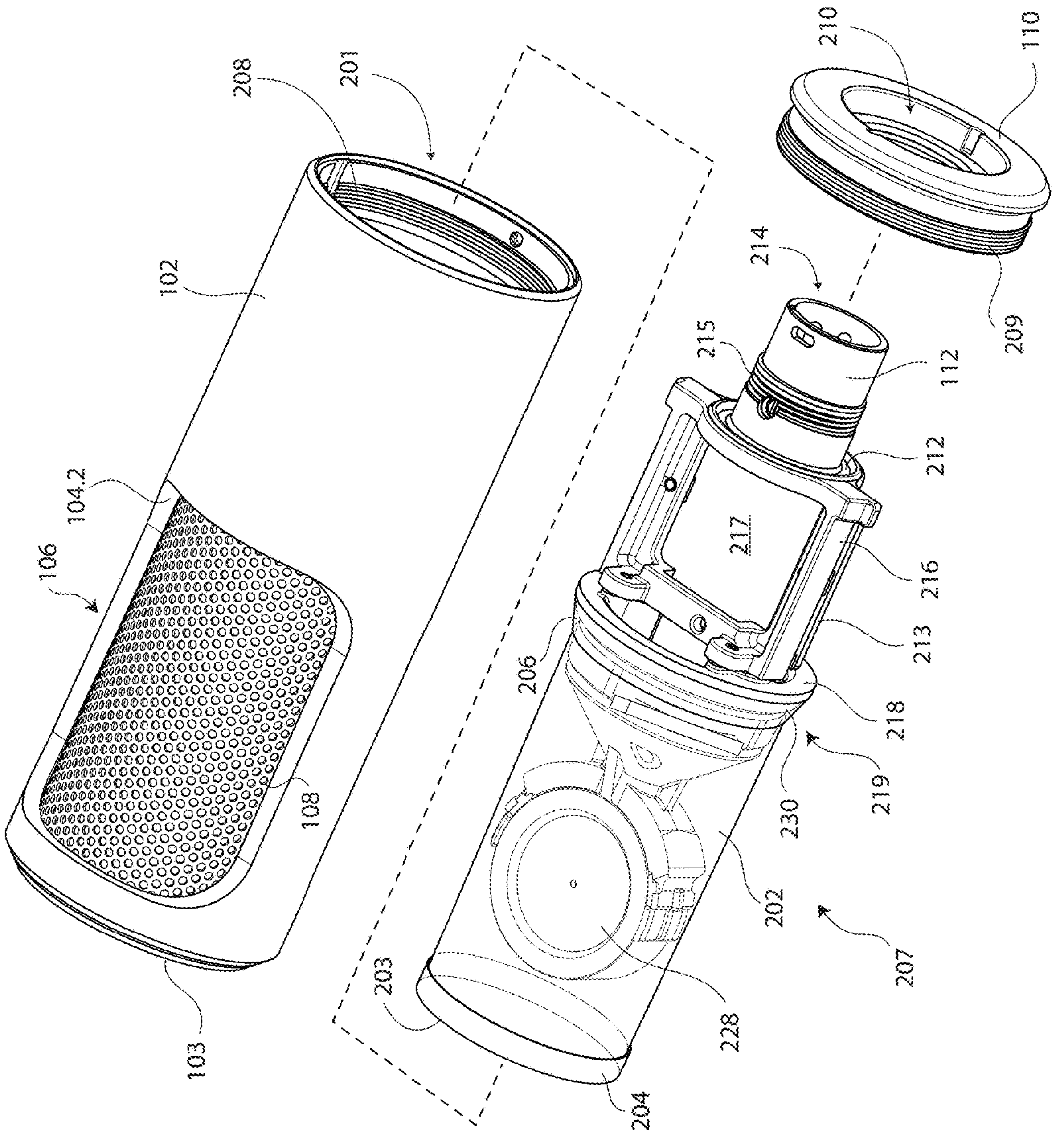
FIG. 4 is an exploded view of the microphone of FIG. 1 according to one or more exemplary embodiments.
Figure 5:
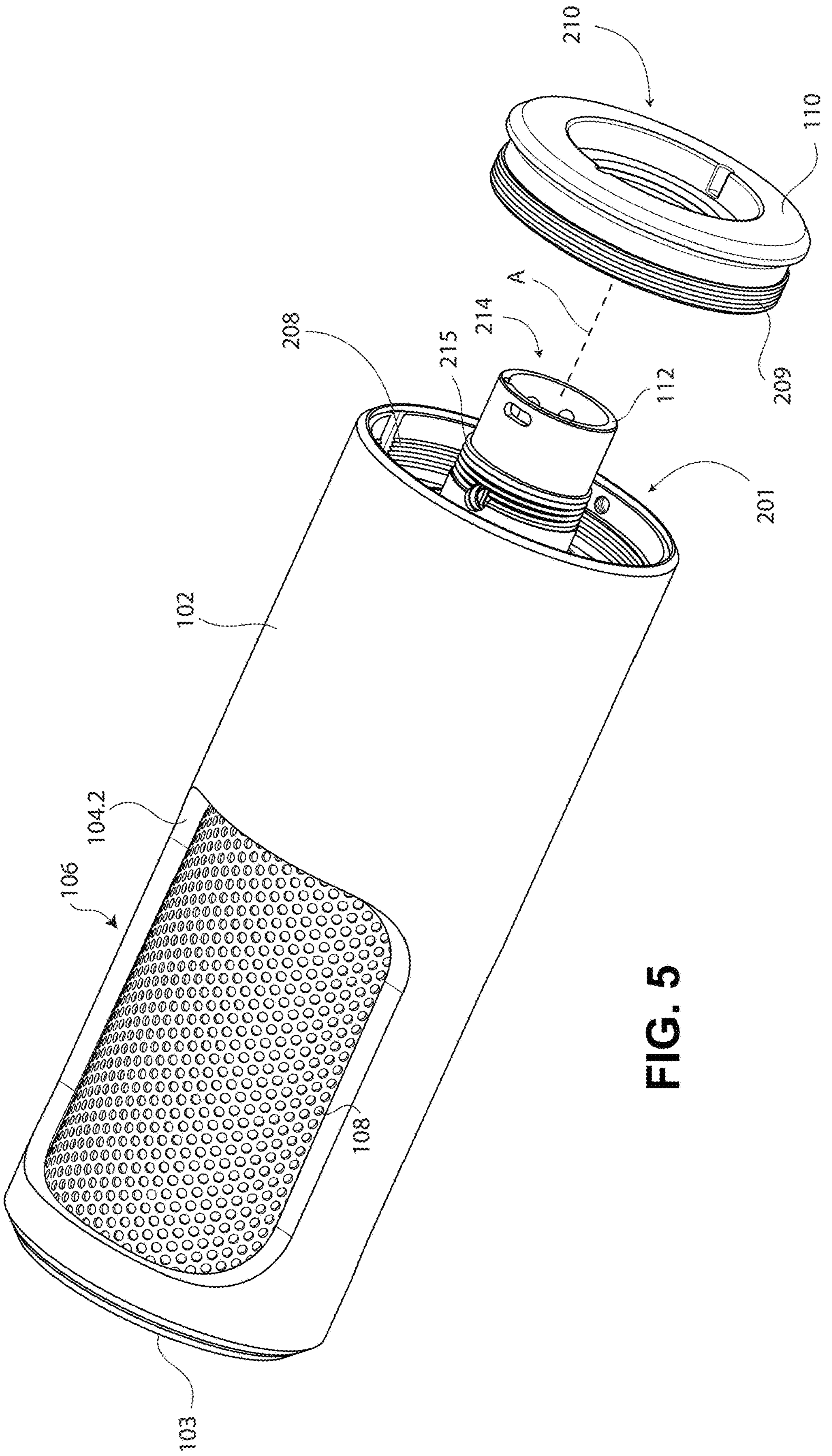
FIG. 5 is an exploded view of the microphone of FIG. 1 according to one or more exemplary embodiments.
Figure 6:
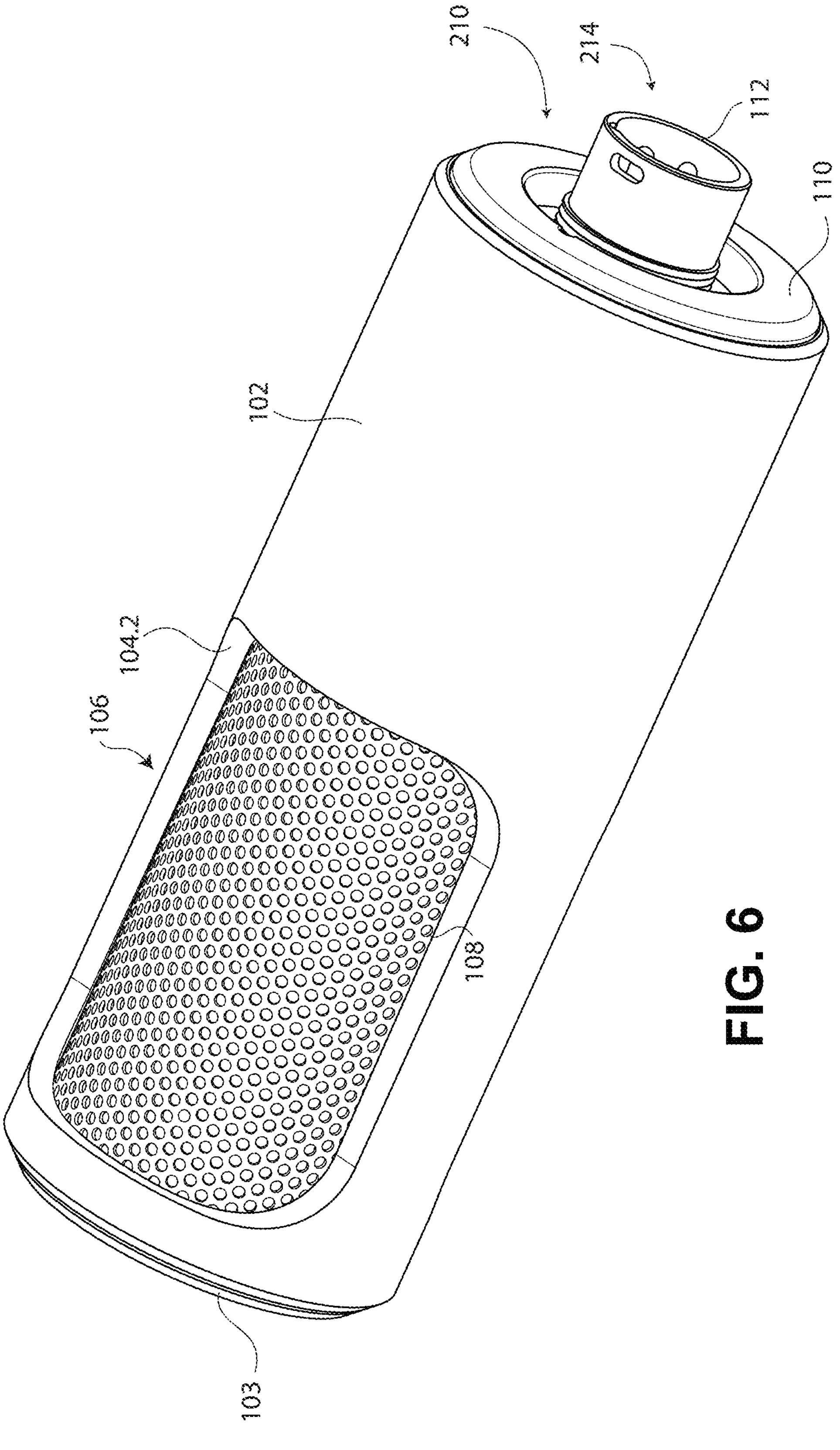
FIG. 6 is a perspective view of the microphone of FIG. 1 according to one or more exemplary embodiments.

FIG. 2 is an exploded view of the microphone 100 of FIG. 1 according to one or more exemplary embodiments. FIGS. 2-6 show the microphone 100 in various stages of assembly progressing from a disassembled state (FIG. 2) to an assembled state (FIG. 6).

Figure 3:
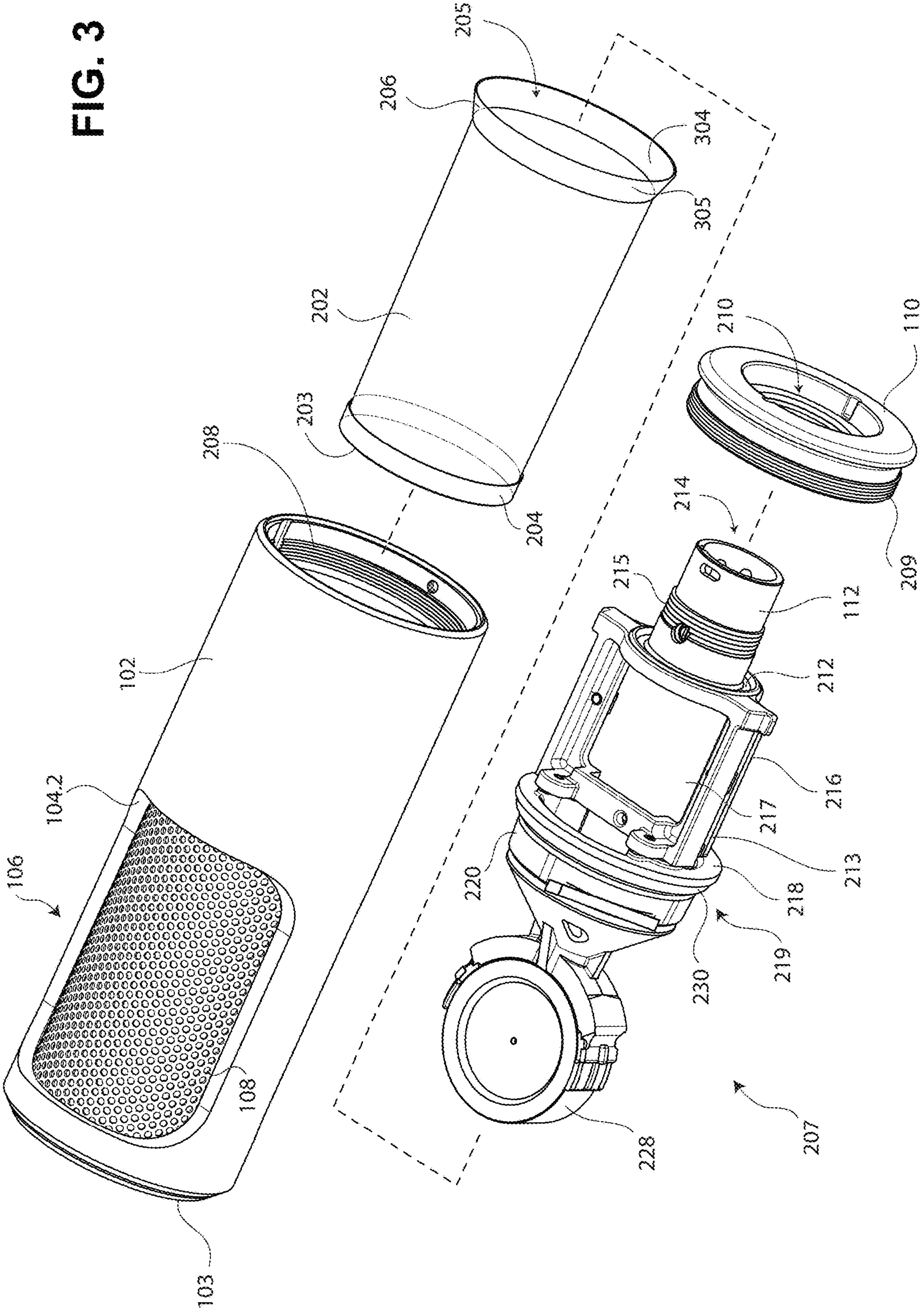
FIG. 3 is an exploded view of the microphone of FIG. 1 according to one or more exemplary embodiments.

The exploded view of FIG. 2 shows the internal components forming the microphone body 207 of the microphone 100. The microphone body 207 may include: shield 202; frame 216 that supports cartridge 228 and has input/output (I/O) interface 112; and a biasing member 230. The microphone body 207 may be enclosed within the housing 102 by retainer 110. These components are discussed in more detail below. In an exemplary embodiment, the frame 216 may be formed from, for example, zinc or a zinc alloy. In other aspects, the frame 216 may be formed from one or more other metals or metal alloys (e.g., steel, aluminum, or an aluminum alloy). FIG. 3 shows the biasing member 230 being disposed on the frame 216 in receptacle 219. The receptacle 219 may be a groove in one or more aspects. FIG. 4 shows the shield 202 disposed over the cartridge 228 and cartridge support 220, as well as on the biasing member 230 seated in the receptacle 219. FIG. 5 shows the assembly of FIG. 4 being inserted into the housing 102 prior to the retainer 110 being connected to the housing 102. FIG. 6 shows the retainer 110 connected to the housing 102 to close opening 201 and fix the microphone body 207 within the housing 102.

Figure 11:
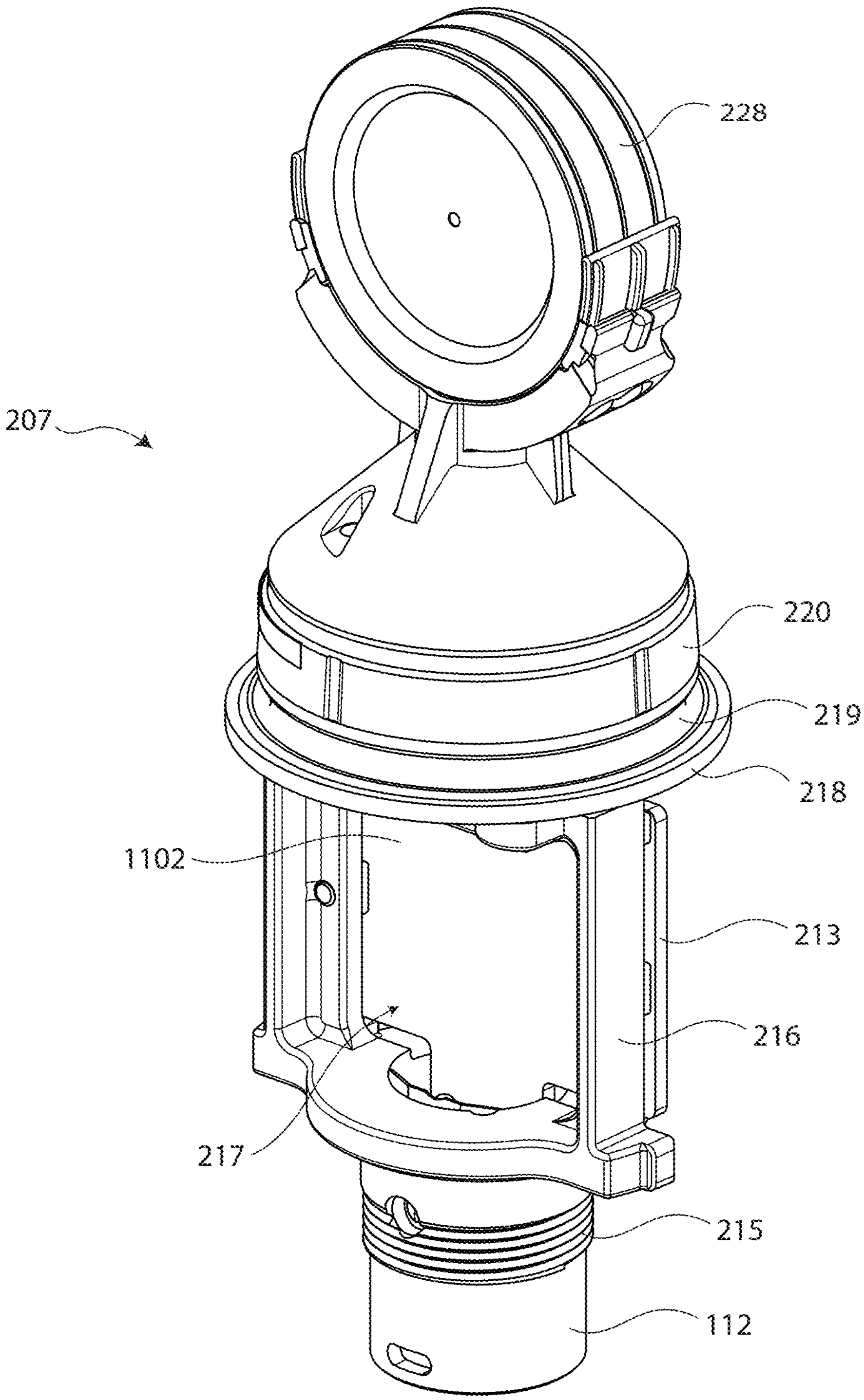
FIG. 11 is a perspective view of a frame according to one or more exemplary embodiments, with an enlarged portion of the shield shown.
Figure 12:
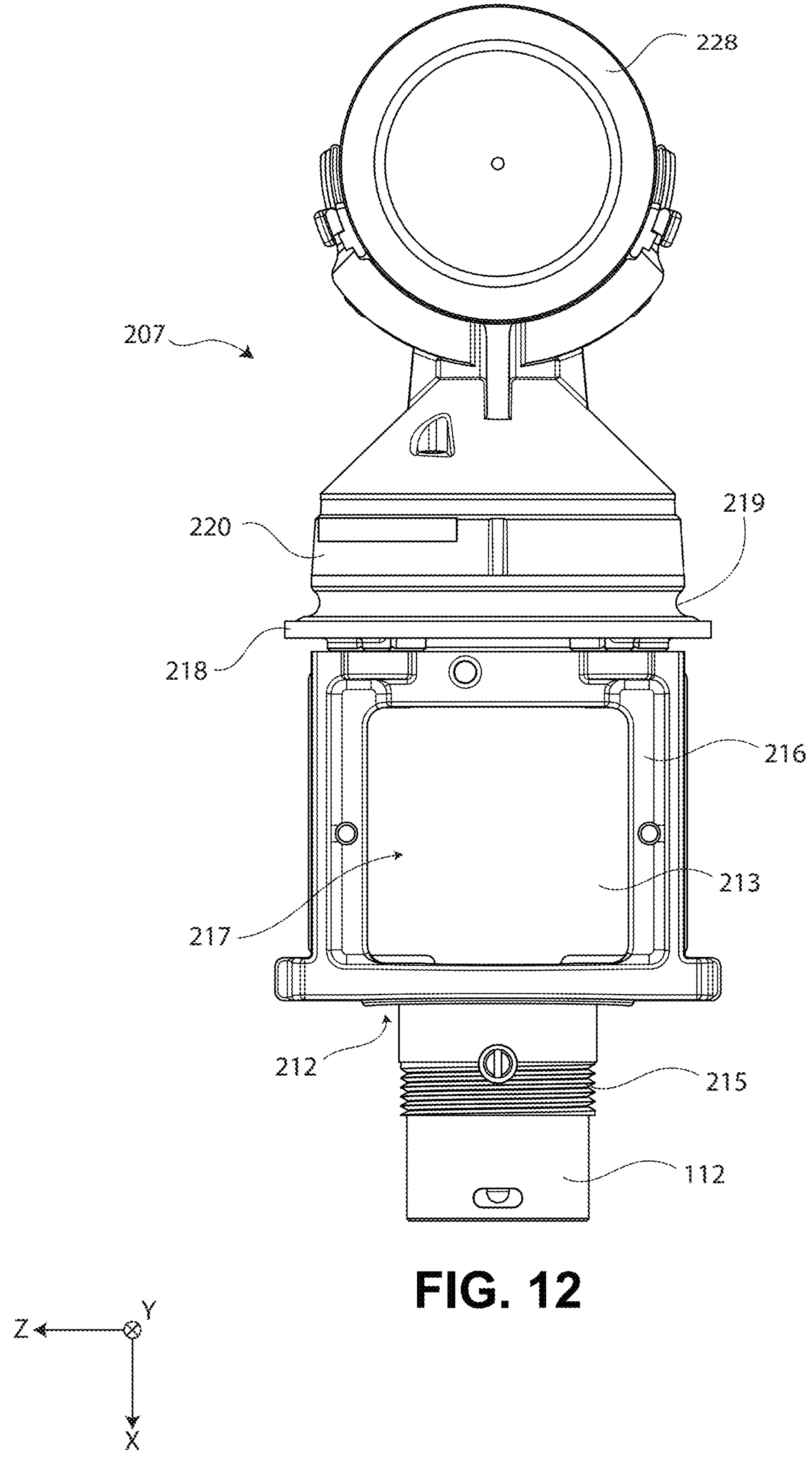
FIG. 12 is a side view of the frame of FIG. 11 according to one or more exemplary embodiments.

The frame 216 of the microphone body 207 may include an upper portion 220, which may be referred to as a cartridge mount 220, at its first end which is adapted to support cartridge 228. The cartridge 228 may include leg portions that connect to the cartridge mount 220. The frame 216 may include the I/O interface 112 at a second end opposite the first end. The frame 216 may include a flange 218 between the cartridge mount 220 and the I/O interface 112 in the axial direction. Adjacent to the flange 218, the frame 216 may include a receptacle 219 adapted to at least partially house the biasing member 230. FIGS. 3, 11, and 12 show the biasing member 230 disposed within the receptacle 219. The flange 218 and receptacle 219 may collectively be referred to as an interface, where the interface is adapted to contact an interior surface of the housing 102 and/or the shield 202 (e.g. flange 206 of the shield 202).

The cartridge 228 may include one or more transducers configured to convert sound waves (e.g., acoustic energy) into electrical signals. For example, the transducers may capture audio from sound waves entering the interior of the housing 102 via the grille(s) 106 and convert the sound waves into electrical signal(s) corresponding to the detected sound waves. The electrical signal(s) corresponding to the detected audio may be processed by circuitry 213 of the microphone body 207 and/or provided as an output of microphone 100 via the I/O interface 112. The circuitry 213 may be disposed within the microphone body 207 in interior area 217 of the frame 216. For example, the circuitry 213 may be in the form of a printed circuit board (PCB) that is disposed in and secured within the area 217. The circuitry 213 may be configured to perform one or more audio processing operations on one or more audio signals generated by the microphone 100 (e.g. by transducer(s) of cartridge 228).

The operation and/or performance of the cartridge 228 (and the transducer(s) therein) may be impacted by electromagnetic radiation (e.g., electrical and/or electromagnetic fields) causing EMI in the cartridge 228. For example, the electromagnetic radiation (e.g., electrical and/or electromagnetic fields) may be generated by low-frequency energy sources (e.g., 50 or 60 Hz AC power noise) and/or from high-frequency energy sources (e.g., RF components producing RF energy). To suppress and/or eliminate electromagnetic radiation within the environment of the cartridge 228, the microphone 100 may include shield 202 that is adapted to block or otherwise reduce the electromagnetic radiation (e.g., low-frequency and/or high-frequency electrical and/or electromagnetic fields from external energy sources outside of the shield 202) from reaching the cartridge 228, thereby eliminating or otherwise reducing an impact of EMI on the cartridge 228. For example, electromagnetic radiation may enter the interior of the housing 102 through the grille(s) 106 and/or other openings or gaps within the housing 102, such as through opening(s) or gap(s) that may be present at the interfacing areas between the grille(s) 106 and the solid portions of the housing 102.

Figure 9:
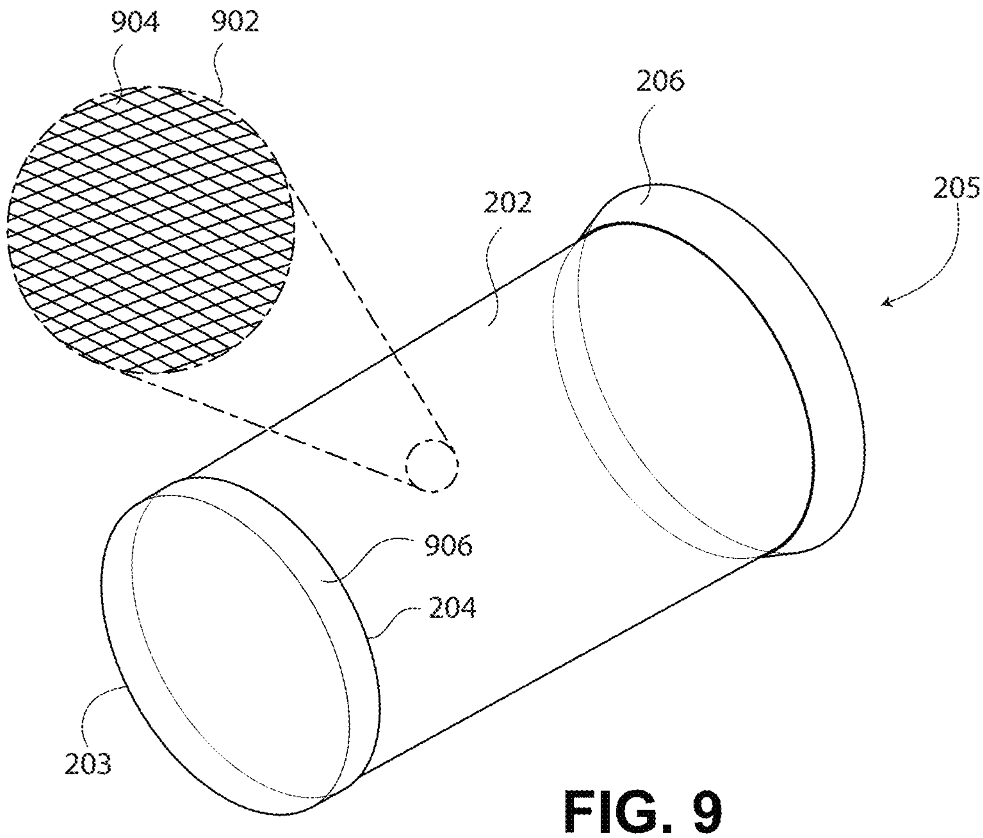
FIG. 9 is a perspective view of a shield according to one or more exemplary embodiments, with an enlarged portion of the shield shown.

In an exemplary embodiment, the shield 202 is electrically conductive. The shield 202 may be formed from, for example, stainless steel (e.g., SAE 304 stainless steel). In other aspects, the shield 202 may be formed from one or more other metals or metal alloys, and/or one or more other electrically conductive materials. In an exemplary embodiment, the shield 202 is a metallic mesh (e.g., woven mesh). In an exemplary embodiment, the shield 202 is woven mesh (see FIG. 9, illustrating a mesh 902 structure). The woven mesh may have a weave size of, for example, 100×100 metallic strands per square inch and/or a wire diameter of, for example, 0.1 millimeters. The weave size and/or wire diameter are not limited to this exemplary configuration. In other aspects, the shield 202 may be formed from, for example, metallic foam, a machined metal component (e.g., metallic plate with machined holes), etc. In an exemplary embodiment, the shield 202 may additionally or alternatively be adapted as a pop filter (e.g., plosive aspects filter).

With reference to FIGS. 2-4, 7, 9, and 10, the shield 202 may have a generally cylindrical shape, but aspects of the disclosure are applicable to other shaped shields (e.g., rectangular, etc.). The shield 202 may be formed from a single piece or multiple pieces of shielding material connected together.

In an exemplary embodiment, the shield 202 may be formed by creating a cylindrical tube, where the circumferential ends are connected together using, for example welding (e.g. continuous welding). In this example, the welds can extend along circumferential ends in the axial direction of the tube-like structure. One end 203 of the shield 202 may be closed using an endcap 204. The endcap 204 may be similarly connected to the cylindrical tube structure using welding (e.g. continuous rotary welding) around the circumference. With the endcap 203 connected, the cylinder may have an opening 205 adapted to accept one or more components of the microphone body 207 as illustrated in FIG. 4.

A portion of the cylindrical structure at the opening 205 may be flared outward in the radial direction to form flange 206 that may extend around the circumference of the shield 202. As shown, the flange 206 may extend entirely around the circumference of the shield 202. In other aspects, the flange 206 may extend partially around the circumference and/or may include two or more non-continuous flared portions. As discussed in more detail below with reference to FIGS. 7-8, the flange 206 may engage the interior of the housing 102 (and form an electrical connection between the housing 102 and shield 202) under the influence of a biasing force generated by the biasing member 230. The biasing member 230 may be compressed (resulting in the generation of the biasing force that is applied to the flange 206). The biasing member 230 may be elastically deformable, and be adapted to elastically deform under compression.

The biasing member 230 may be a gasket, such as an O-ring. In one or more aspects, the biasing member 230 may be formed from one or more synthetic rubbers (e.g., silicone rubber) and/or plastics (e.g., thermoplastics). The biasing member 230 may be configured to a dimension of the frame 216, such as a perimeter or circumference of the frame 216. The receptacle 219 and the biasing member 230 may be configured to have complementary dimensions and/or be complementary shaped.

As discussed in more detail below, the compression of the biasing member 230 may be caused by the retainer 110 engaging the housing 102 and frame 216, which may cause the frame 216 to move into the housing 102 in the axial direction. In an exemplary embodiment, the housing 102 may include a threaded connection 208 adapted to threadedly connect to the threaded connection 209 of the retainer 110. The retainer 110 may include an opening 210 adapted to allow the I/O interface 112 of the frame 216 of the microphone body 207 to pass therethrough. In one or more other aspects, the connections of the retainer 110 to the housing 102 and/or I/O interface 112 may be formed using other fastening techniques, such as friction-fitting, push-fitting, twist-and-lock, compression, barbed, etc. Additionally, or alternatively, one or more fasteners may be used, such as mechanical fasteners (e.g., bolts, screws, rivets, pins, etc.), welding, and/or adhesives.

Figure 13:
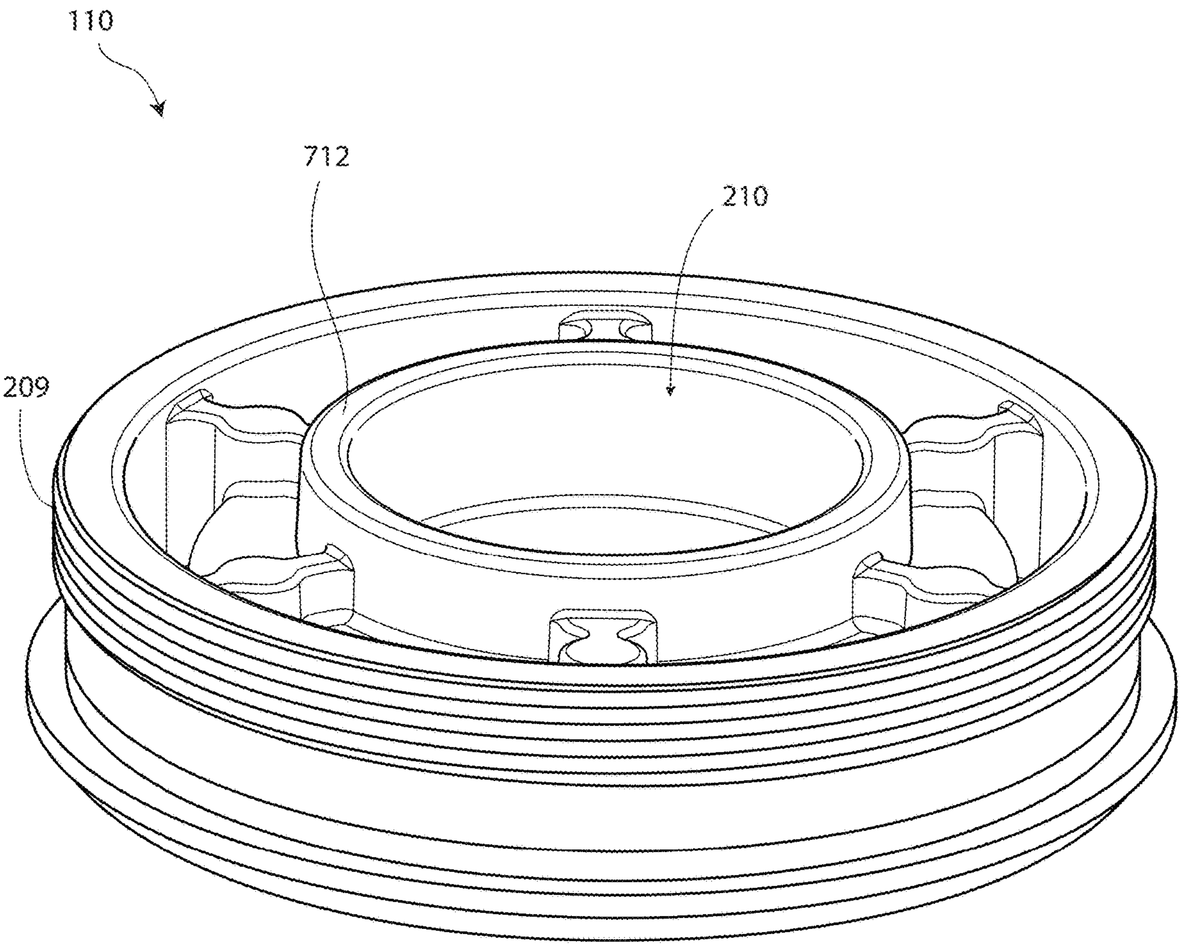
FIG. 13 is a perspective view of the retainer according to one or more exemplary embodiments.

In an exemplary embodiment, the retainer 110 may establish an electrical connection to the housing 102 when threadedly connected via the threaded connection interface of threaded connections 208, 209, and/or may establish an electrical connection to the microphone body 207 via engagement of the circumferential rib 712 (FIGS. 7, 13, and 14) with the circumferential recess 212 of the frame 216. The circumferential rib 712 may define the circumference of the opening 210 and may extend axially from the retainer 110. When assembled, the circumferential rib 712 may extend axially into the interior of the housing 102 and engage the circumferential recess 212 of the frame 216 disposed therein to form a mating connection between the circumferential rib 712 and circumferential recess 212 (see FIG. 7). Further, the mechanical connections of the retainer 110 to the housing 102 and the frame 216 may collectively fix and secure the microphone body 207 within the housing 102. As discussed above, the mechanical connections of the retainer 110 to the housing 102 and/or the frame 216 may contribute (e.g., bias the frame 216 in the axial direction) to establishing the mechanical and/or electrical connection of the shield 202 to the housing 102. These connections are further illustrated in FIGS. 7-8, and discussed in more detail below.

In an exemplary embodiment, as the threaded connection 209 of the retainer 110 is threaded onto the threaded connection 208 of the housing 102, the retainer 110 and the frame 216 may move into the housing 102 in the axial direction (negative X-direction in FIG. 1, along the direction A in FIG. 5). This axial movement may cause the frame 216 to engage an interior surface of the housing 102. The retainer 110 may be adapted to removably connect (e.g., electrically and mechanically) to the housing 102, and bias the microphone body 207 (e.g., frame 216) into the interior of the housing 102 based on the (axial) engagement of the circumferential rib 712 with the circumferential recess 212 of the frame 216. In this example, the biasing of the microphone body 207 (e.g., frame 216) into the interior of the housing 102 may cause the biasing member 230 to engage the shield 202 (flange 206 of the shield 202) and compress, thereby generating a bias force that biases the shield 202 into contact with the interior surface of the housing 102. The contact with the housing 102 may form an electrical connection between the shield 202 and the housing 102. The microphone body 207 (e.g., frame 216) may additionally form an electrical connection with the housing via the mechanical and electrical connection of the retainer 110 with the microphone body 207 and with the housing 102.

The interior surface of the housing 102 and the frame 216 may be dimensioned such that an outer dimension of the frame 216 complements an inner dimension of the housing 102. In an exemplary embodiment, as the frame 216 moves in the axial direction into the housing 102, the frame 216 may be friction fitted within the housing 102.

Figure 7:
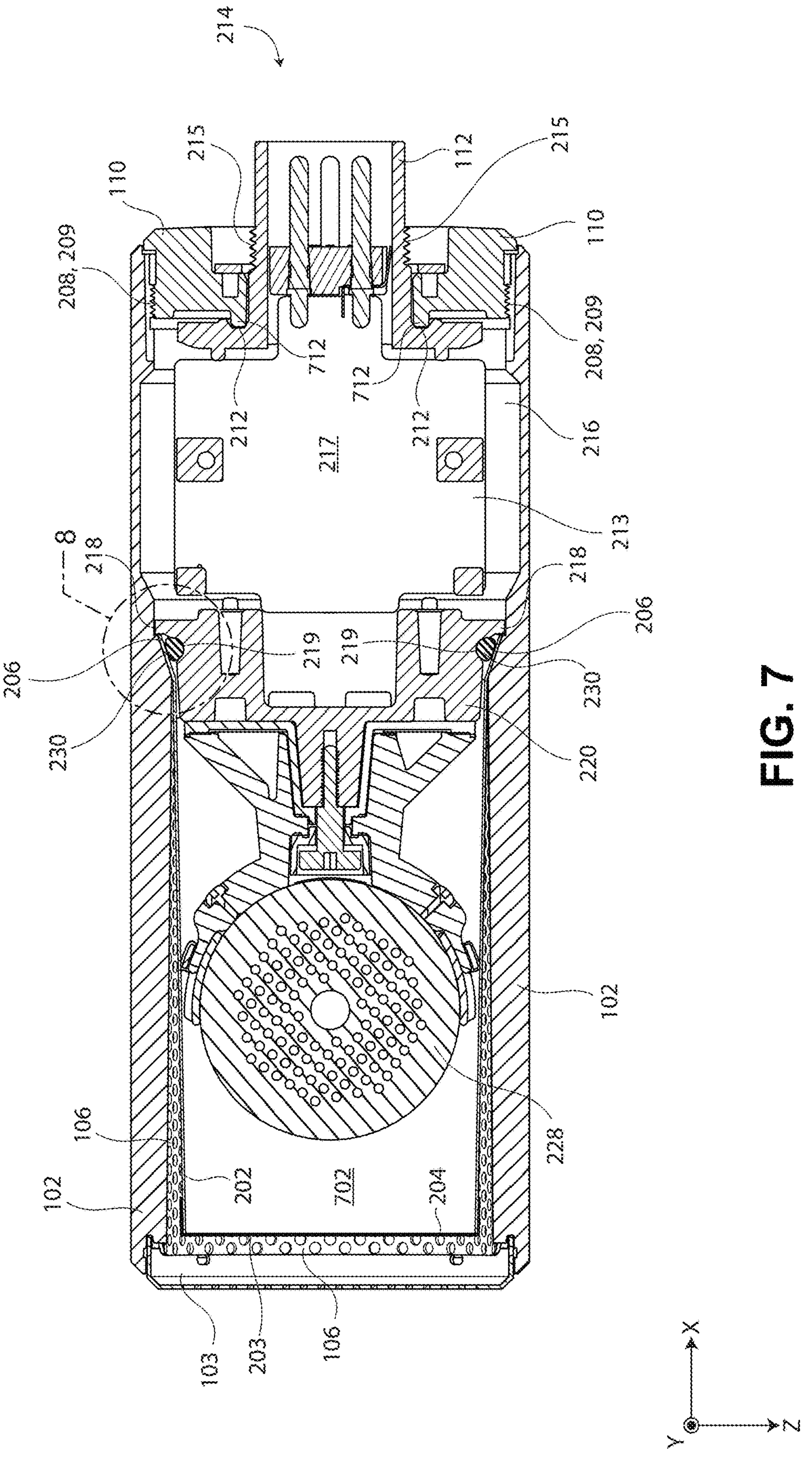
FIG. 7 is a cross-sectional view of the microphone of FIG. 1 taken along 7-7 according to one or more exemplary embodiments.
Figure 8:
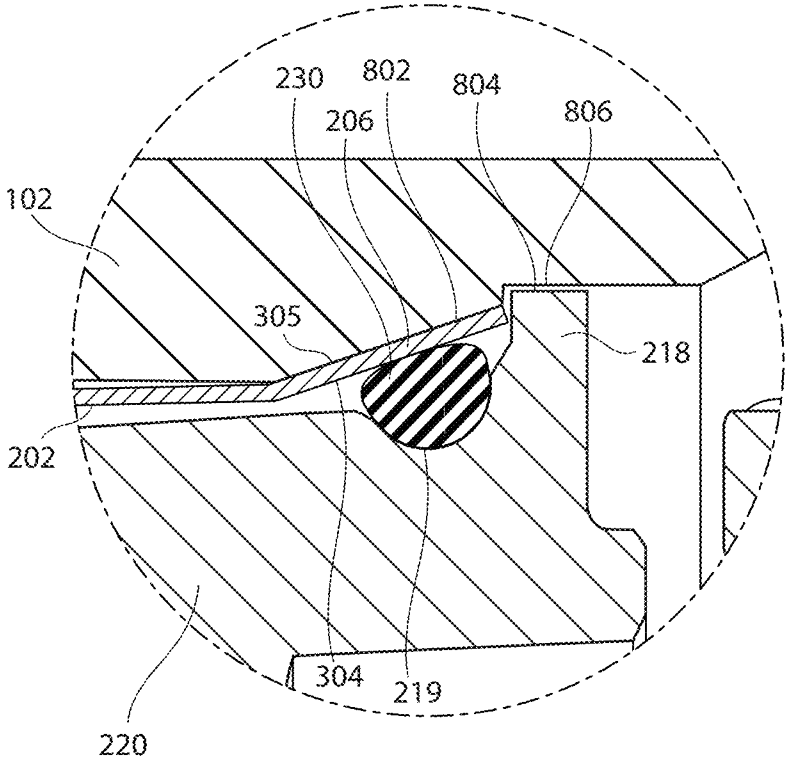
FIG. 8 is an enlarged, partial view of the microphone of FIG. 7 according to one or more exemplary embodiments.

Turning to FIGS. 7-8, the mechanical and/or electrical connections of the shield 202 and/or frame 216 to the housing 102 are illustrated in the cross-sectional view of the assembled microphone 102. As discussed, the microphone body 207 may include: shield 202; frame 216 that supports cartridge 228 and input/output (I/O) interface 112; and a biasing member 230. As assembled, the microphone body 207 is enclosed within the housing 102 and retainer 110. For example, the cartridge 228 and at least a portion of the cartridge support 220 of the frame 216 are disposed within the interior 702 of the shield 202. The biasing member 230 is seated as least partially in the receptacle 219 of the frame 216 (see also FIGS. 11-12). The retainer 110 is connected to the housing 102.

As discussed above, the retainer 110 may be ring-shaped and include an opening 210. The I/O interface 112 may at least partially extend into the opening 210. As shown in FIG. 7, the I/O interface 112 extends through the opening 210 and out of the structure formed by the housing 102 and retainer 110. The threaded connection 215 located on the exterior of the I/O interface 112 may be threadedly engaged with a mount (e.g., hard mount, shock mount, or the like) to removably mount the microphone 100. The retainer 110 may include exterior threaded connection 209 that may be threadedly engaged with the internal threaded connection 208 of the housing 102 to form a mated connection between the retainer 110 and the housing 102. For example, the retainer 110 may be threadedly connected to the housing 102 by the threaded connection interface of threaded connections 208, 209. This connection may establish an electrical connection between the retainer 110 and the housing 102. Further, by the retainer 110 threadedly connecting to the housing 102, which causes the retainer 110 to move towards the housing 102 and frame 216 in the axial direction, the circumferential rib 712 engages with (e.g., is inserted into) the circumferential recess 212 of the frame 216 to establish a mated connection. This connection may similarly establish an electrical connection between the retainer 110 and the microphone body 207, including the frame 216, thereby electrically connecting the housing 102, frame 216, and retainer 110.

In one or more other aspects, the connections of the retainer 110 to the housing 102 and/or I/O interface 112 may be formed using other fastening techniques, such as friction-fitting, push-fitting, twist-and-lock, compression, barbed, etc. Additionally, or alternatively, one or more fasteners may be used, such as mechanical fasteners (e.g., bolts, screws, rivets, pins, etc.), welding, and/or adhesives.

In an exemplary embodiment, as the threaded connection 209 the retainer 110 is threaded onto the threaded connection 208 of the housing 102, the retainer 110 and the frame 216 may move into the housing 102 in the axial direction (negative X-direction in FIG. 1, along the direction A in FIG. 5). This axial movement may cause the frame 216 to engage one or more portions of the interior surface of the housing 102, such as surfaces 802 and/or 806. The retainer 110 may be adapted to removably connect (e.g., electrically and mechanically) to the housing 102 and bias the microphone body 207 (e.g., frame 216) into the interior of the housing 102 via the interface of the circumferential rib 712 with the circumferential recess 212. In this example, the biasing of the microphone body 207 (e.g., frame 216) into the interior of the housing 102 may cause the biasing member 230 to engage the shield 202 (flange 206 of the shield 202) and compress, thereby generating a bias force that biases the shield 202 into contact with the interior surface 802 of the housing 102. The contact with the surface 802 of the housing 102 may form an electrical connection between the shield 202 and the housing 102. The microphone body 207 (e.g., frame 216) may additionally form an electrical connection with the housing 102 as discussed in more detail below, with reference to FIG. 8.

In an exemplary embodiment, the mechanical connections of the retainer 110 to the housing 102 and the frame 216 collectively fix and secure the microphone body 207 (including the frame 216) within the housing 102. As discussed above, the mechanical connections of the retainer 110 to the housing 102 and/or the frame 216 urges (e.g., biases) the frame 216 in the axial direction (negative X-direction) into the interior of the housing 102. As illustrated, at least a portion of the interior surfaces of the housing 102 are contoured to gradually reduce the size of the interior in the radial direction (along the Z-direction). For example, the contour of the interior surface 802 (FIG. 8) of the housing 102 forms a funnel-like arrangement adjacent to the cartridge support 220 of the frame 216 when the microphone body 207 is positioned within the housing 102. With this structure, as the frame 216 moves in the axial direction into the housing 102, the distance between the interior surface 802 and the frame 216 (cartridge support 220) decreases in the radial direction to facilitate: the contact of the shield 202 (flange 206) with the interior surface 802 of the housing 102 and/or the contact of the surface 804 of the flange 218 (of the frame 216) and the interior surface 806 of the housing 102, which is shown in detail in FIG. 8. As should be understood, a spacing is shown between surface 804 and surface 806 for the sake of illustration and clarity. In an exemplary embodiment, these surfaces 804 and 806 may physically contact each other, which may establish an electrical connection between the frame 216 and the housing 102 according to the disclosure.

As discussed above, the biasing member 230 may be adapted to facilitate a physical contact between the shield 202 and the housing 102. The frame 216 may at least partially house the biasing member 230 in receptacle 219. The receptacle 219 may be a groove, where the biasing member 230 may be at least partially disposed in the groove. The biasing member 230 may be a gasket, such as an O-ring. In one or more aspects, the biasing member 230 may be formed from one or more synthetic rubbers (e.g., silicone rubber) and/or plastics (e.g., thermoplastics). The biasing member 230 may be configured to a dimension of the frame 216, such as a perimeter or circumference of the frame 216. The receptacle 219 and the biasing member 230 may be configured to have complementary dimensions and/or be complementary shaped.

A natural, uncompressed state of the biasing member is illustrated in FIGS. 2-4, 11, and 12. When in an uncompressed state, the biasing member 230 may have, for example, a circular cross-section. As illustrated in FIGS. 7-8, the biasing member 230 is in a compressed state resulting in an elastic deformation of the biasing member 230. For example, the side of the biasing member 230 contacting the flat surface of the flange 206 and flat interior surface 802 deforms to become flatter, while the portions of the biasing member 230 contacting the receptacle 219 take the shape of the receptacle 219.

The compression of the biasing member 230 is caused by the (indirect) engagement of the biasing member 230 with the surface 802. As shown, the flange 206 of the shield 202 is sandwiched between the biasing member 230 and the interior surface 802 of the housing 102. Specifically, with reference to FIGS. 3 and 8, the biasing member 230 contacts the interior side (inner surface) 304 of flange 206, which causes the exterior side (outer surface) 305 of the flange 206 to contact the interior surface 802 of the housing 102. This engagement, as discussed above, may be caused by the retainer 110 engaging the housing 102 and frame 216, which may cause the frame 216 to move into the housing 102 in the axial direction. For example, the flange 206 of the shield 202 is biased into contact with the interior surface 802 (FIG. 8) of the housing 102 by the bias force generated by the biasing member 230 that is elastically deformed and under compression. The contact between the shield 202 and the surface 802 may form an electrical connection between the shield 202 and the housing 102.

In aspects where an electrical connection is established between the shield and housing 102, the shield 202, frame 216, housing 102 and retainer 110 all become electrically connected to each other. This collective electrical connection may form a Faraday cage around the cartridge 228 and/or internal circuitry of the microphone 100, such as circuitry 213 housed in interior area 217. In an exemplary embodiment, via the I/O interface 112 (e.g., XLR connection), the housing 102, shield 202, frame 216, and retainer 110 may be further electrically connected to one or more audio components, which may provide an electrical connection to ground, thereby grounding the microphone 100 and the established Faraday cage.

Figure 10:
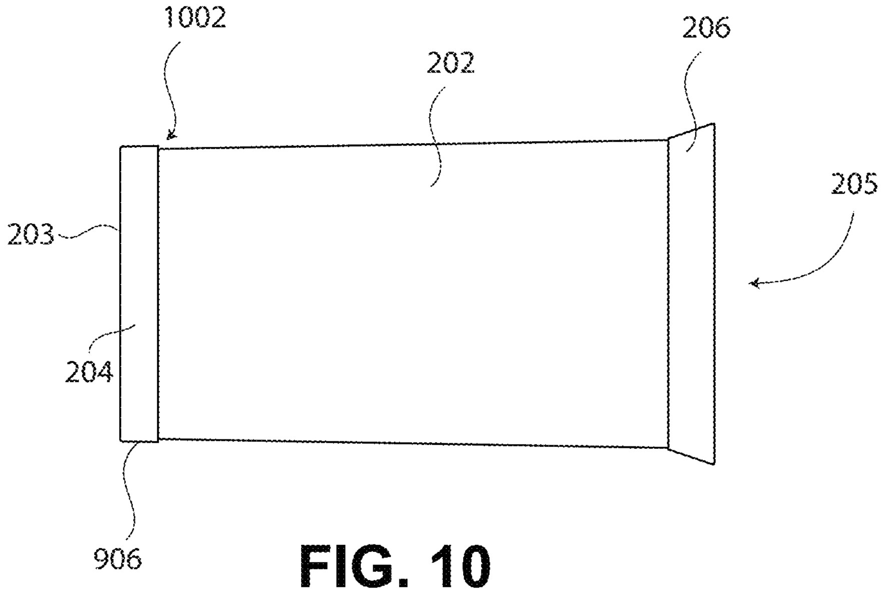
FIG. 10 is a side view of the shield of FIG. 9 according to one or more exemplary embodiments.

Turning to FIGS. 9 and 10, as discussed above, the shield 202 may have a generally cylindrical shape, but aspects of the disclosure are applicable to other shaped shields (e.g., rectangular, etc.). The shield 202 may be formed from a single piece or multiple pieces of shielding material connected together.

In an exemplary embodiment, the shield 202 may be formed by creating a cylindrical tube, where the circumferential ends are connected together using, for example, welding (e.g. continuous welding). In this example, the welds can extend along circumferential ends in the axial direction of the tube-like structure. One end 203 of the shield 202 may be closed using an endcap 204. The endcap 204 may be similarly connected to the cylindrical tube structure using welding (e.g. continuous welding) around the circumference. For example, the endcap 204 may have a coreferential extension 906 that extends in the axial direction and overlaps with a portion of the cylindrical tube creating an overlapping portion and forming a ridge or lop 1002. With the endcap 203 connected, the cylinder may have an opening 205 adapted to accept one or more components of the microphone body 207.

The shield 202 may be formed of metal, such as stainless steel (e.g., SAE 304 stainless steel). In other aspects, the shield 202 may be formed from one or more other metals or metal alloys, and/or one or more other electrically conductive materials. In an exemplary embodiment, the shield 202 is a metallic mesh (e.g., woven mesh) having one or more openings 904. The openings 904 may be similarly or differently dimensioned. In an exemplary embodiment, the shield 202 is woven mesh having a woven pattern 902. As discussed above, the woven mesh may have a weave size of 100×100 metallic strands per square inch and/or wire diameter of 0.1 millimeters. In an exemplary embodiment, the weave size and/or wire diameter is determined based on the desired shielding properties (e.g., the frequencies to be blocked by the shield 202). For example, the weave size and/or wire diameter may be selected to allow audio energy to pass through the shield 202 while blocking one or more signals of a particular frequency or frequency range. For example, the shield 202 may be adapted to block signals of frequencies of, for example (but not limited to): one or more wireless communication protocols (e.g., IEEE 802.11 WIFI protocol, 3GPP cellular protocol, and/or other RF frequencies), FM radio, ISM bands (e.g., a 2.4 GHz-2.5 GHz band, a 5.75 GHz-5.875 GHz band, a 24 GHz-24.25 GHz band, and/or a 61 GHz-61.5 GHz band, etc.), VHF band (e.g., 30 MHz-300 MHz band), and/or UHF band (e.g., 300 MHz-3 GHZ). Additionally, or alternatively, the shield 202 may be adapted to block frequencies from electrical energy sources, such as AC power noise, also known as "hum" (e.g., 50 or 60 Hz), or other sources. As discussed above, the shield 202 is not limited to woven mesh structures and the shield 202 may be formed from, for example, metallic foam, a machined metal component (e.g., metallic plate with machined holes), etc. In an exemplary embodiment, the shield 202 may additionally or alternatively be adapted as a pop filter (e.g., plosive aspects filter).

With continued reference to FIG. 9-10, as discussed above, a portion of the cylindrical structure at the opening 205 may be flared outward in the radial direction to form flange 206 that may extend around the circumference of the shield 202. The flange 206 may extend entirely around the circumference of the shield 202. In other aspects, the flange 206 may extend partially around the circumference and/or may include two or more non-continuous flared portions. As discussed above, the flange 206 may engage the interior of the housing 102 (and form an electrical connection between the housing 102 and shield 202) under the influence of a biasing force generated by the biasing member 230. In one or more aspects, the shield 202 may be elastically deformable and may deform under the biasing force of the biasing member 230.

Aspects of the disclosure have been described in terms of illustrative embodiments thereof. Numerous other embodiments, modifications, and variations within the scope and spirit of the appended claims will occur to persons of ordinary skill in the art from a review of this disclosure. For example, one or more of the steps depicted in the illustrative figures may be performed in other than the recited order, and one or more depicted steps may be optional in accordance with aspects of the disclosure.

EXAMPLES

The following examples pertain to various aspects of the present disclosure.

Example 1. A device comprising: a support comprising an interface; an audio transducer disposed on the support; a shield adapted to suppress electromagnetic radiation, the shield defining an interior adapted to house the audio transducer and at least a portion of the support; and a housing adapted to house the audio transducer, the shield, and at least the portion of the support, wherein the support is adapted to contact the housing, and the interface is adapted to engage the shield into a contact with the housing.

Example 2. The device of example 1, further comprising a biasing member adapted to bias the shield into the contact with the housing, wherein the interface comprises a receptacle adapted to receive and at least partially house the biasing member.

Example 3. The device of example 2, wherein the biasing member is adapted to elastically deform based on engagement of the interface with the shield and the housing.

Example 4. The device of example 3, wherein the biasing member is a gasket adapted to elastically deform based on the engagement of the interface with the shield and the housing, and to correspond to a perimeter of the support at the receptacle.

Example 5. The device of example 2, wherein the shield comprises a flange having an inner surface and an outer surface opposite the inner surface, the inner surface being adapted to contact the biasing member and the outer surface being adapted to contact housing.

Example 6. The device of example 2, wherein the shield is disposed between the biasing member and the housing.

Example 7. The device of any of examples 1-6, further comprising a retainer adapted to removably connect to the housing and affix the support within the interior of the housing.

Example 8. The device of example 7, wherein the retainer is further adapted to bias the support into the interior of the housing in an axial direction of the housing, the engagement of the shield into the contact with the housing being based on the biasing of the support into the housing.

Example 9. The device of any of examples 7-8, wherein the retainer, housing, support, and shield collectively form a Faraday cage.

Example 10. The device of example 9, wherein the Faraday cage is formed based on the connection of the retainer to the housing, the contact of the support with the housing, and the engagement of the shield into the contact with the housing.

Example 11. The device of any of examples 1-7, wherein the housing, support, and shield collectively form a Faraday cage.

Example 12. The device of any of examples 1-11, wherein the shield is cylindrically shaped having a first open axial end in which the audio transducer and support are passable, and a second closed axial end.

Example 13. The device of any of examples 1-12, wherein the shield comprises a metallic woven mesh.

Example 14. A device comprising: a frame comprising a biasing member and adapted to support a cartridge; a conductive shield adapted to at least partially cover the cartridge and to shield the cartridge from electromagnetic radiation; and a housing adapted to house the frame, the cartridge, and the shield, wherein the biasing member is adapted to bias the shield into a contact with an interior surface of the housing.

Example 15. The device of example 14, wherein the frame is adapted to contact the interior surface of the housing.

Example 16. The device of any of examples 14-15, further comprising a retainer adapted to removably connect to the housing and the frame, and affix the frame within the housing.

Example 17. The device of example 16, wherein the retainer is adapted to bias the frame into an interior of the housing, the biasing of the frame causing the biasing member to engage the shield and bias the shield into the contact with the interior surface of the housing.

Example 18. The device of any of examples 14-17, wherein the frame comprises a groove adapted to at least partially retain the biasing member.

Example 19. A device comprising: a frame having a first end and a second end opposite the first end; a biasing member disposed on the frame between the first end and the second end; an electromagnetic shield adapted to cover at least a portion of the first end of the frame; and a housing adapted to house the shield and the first end of the frame, wherein the biasing member is adapted to bias the shield to form an electrical connection between the shield and the housing.

Example 20. The device of example 19, further comprising a retainer adapted to removably connect to the housing and the second end of the frame to bias the frame into an interior of the housing, the biasing of the frame causing the biasing member to engage the shield and bias the shield into forming the electrical connection between the shield and the housing, wherein the connection of the retainer to the housing and the frame forms electrical connections between the frame, the retainer, and the housing.

Example 21. The device of any of examples 19-20, further comprising a transducer disposed on the first end of the frame, wherein the electromagnetic shield is adapted to cover the transducer and the housing is adapted to house the transducer.

Example 22. A device comprising: supporting means comprising an interfacing means; audio transducing means disposed on the supporting means; shielding means for suppressing electromagnetic radiation, the shielding means defining an interior for housing the audio transducing means and at least a portion of the supporting means; and housing means for housing the audio transducing means, the shielding means, and at least the portion of the supporting means, wherein the supporting means is adapted to contact the housing means, and the interface means is for engaging the shielding means into a contact with the housing means.

Example 23. The device of example 22, further comprising a biasing means for biasing the shielding means into the contact with the housing means, wherein the interface comprises a receptacle adapted to receive and at least partially house the biasing means.

Example 24. The device of example 23, wherein the biasing means is adapted to elastically deform based on engagement of the interface with the shielding means and the housing means.

Example 25. The device of example 24, wherein the biasing means is a gasket adapted to elastically deform based on the engagement of the interface with the shielding means and the housing means, and to correspond to a perimeter of the supporting means at the receptacle.

Example 26. The device of example 23, wherein the shielding means comprises a flange having an inner surface and an outer surface opposite the inner surface, the inner surface being adapted to contact the biasing means and the outer surface being adapted to contact housing means.

Example 27. The device of example 23, wherein the shielding means is disposed between the biasing means and the housing means.

Example 28. The device of any of examples 22-27, further comprising retaining means for removably connecting to the housing means and affixing the supporting means within the interior of the housing means.

Example 29. The device of example 28, wherein the retaining means is further adapted to bias the supporting means into the interior of the housing means in an axial direction of the housing means, the engagement of the shielding means into the contact with the housing means being based on the biasing of the supporting means into the housing means.

Example 30. The device of any of examples 28-29, wherein the retaining means, housing means, supporting means, and shielding means collectively form a Faraday cage.

Example 31. The device of example 30, wherein the Faraday cage is formed based on the connection of the retaining means to the housing means, the contact of the supporting means with the housing means, and the engagement of the shielding means into the contact with the housing means.

Example 32. The device of any of examples 22-28, wherein the housing means, supporting means, and shielding means collectively form a Faraday cage.

Example 33. The device of any of examples 22-32, wherein the shielding means is cylindrically shaped having a first open axial end in which the audio transducing means and supporting means are passable, and a second closed axial end.

Example 34. The device of any of examples 22-33, wherein the shielding means comprises a metallic woven mesh.

Example 35. A device comprising: framing means comprising biasing means and for supporting a cartridge; conductive shielding means for at least partially covering the cartridge and for shielding the cartridge from electromagnetic radiation; and housing means for housing the framing means, the cartridge, and the shielding means, wherein the biasing means is for biasing the shielding means into a contact with an interior surface of the housing means.

Example 36. The device of example 35, wherein the framing means is adapted for contacting the interior surface of the housing means.

Example 37. The device of any of examples 35-36, further comprising retaining means for removably connecting to the housing means and the framing means, and affix the framing means within the housing means.

Example 38. The device of example 37, wherein the retaining means is adapted for biasing the framing means into an interior of the housing means, the biasing of the framing means causing the biasing means to engage the shielding means and bias the shielding means into the contact with the interior surface of the housing means.

Example 39. The device of any of examples 35-38, wherein the framing means comprises a groove for at least partially retaining the biasing means.

Example 40. A device comprising: framing means having a first end and a second end opposite the first end; biasing means disposed on the framing means between the first end and the second end; electromagnetic shielding means for covering at least a portion of the first end of the framing means; and housing means for housing the shielding means and the first end of the framing means, wherein the biasing means is adapted to bias the shielding means to form an electrical connection between the shielding means and the housing means.

Example 41. The device of example 40, further comprising retaining means for removably connecting to the housing means and the second end of the framing means for biasing the framing means into an interior of the housing means, the biasing of the framing means causing the biasing means to engage the shielding means and bias the shielding means into forming the electrical connection between the shielding means and the housing means, wherein the connection of the retaining means to the housing means and the framing means forms electrical connections between the framing means, the retaining means, and the housing means.

Example 42. The device of any of examples 40-41, further comprising transducing means disposed on the first end of the frame, wherein the electromagnetic shield is adapted to cover the transducer and the housing is adapted to house the transducer.

Example 43. The device of any of examples 1-42, wherein the device is a microphone.

Example 44. A device as shown and described.

Example 45. An audio device as shown and described.

Example 46. A microphone as shown and described.

Example 47. A shield as shown and described.

The invention claimed is:

1. A microphone comprising:

a support comprising an interface;

an audio transducer disposed on the support;

a shield adapted to suppress electromagnetic radiation, the shield defining an interior adapted to house the audio transducer and at least a portion of the support; and a housing adapted to house the audio transducer, the shield, and at least the portion of the support, wherein the support is adapted to contact the housing, and the interface is adapted to engage the shield into a contact with the housing.

2. The microphone of claim 1, further comprising a biasing member adapted to bias the shield into the contact with the housing, wherein the interface comprises a receptacle adapted to receive and at least partially house the biasing member.

3. The microphone of claim 2, wherein the biasing member is adapted to elastically deform based on engagement of the interface with the shield and the housing.

4. The microphone of claim 3, wherein the biasing member is a gasket adapted to elastically deform based on the engagement of the interface with the shield and the housing, and to correspond to a perimeter of the support at the receptacle.

5. The microphone of claim 2, wherein the shield comprises a flange having an inner surface and an outer surface opposite the inner surface, the inner surface being adapted to contact the biasing member and the outer surface being adapted to contact the housing.

6. The microphone of claim 2, wherein the shield is disposed between the biasing member and the housing.

7. The microphone of claim 1, further comprising a retainer adapted to removably connect to the housing and affix the support within the interior of the housing.

8. The microphone of claim 7, wherein the retainer is further adapted to bias the support into the interior of the housing in an axial direction of the housing, the engagement of the shield into the contact with the housing being based on the biasing of the support into the housing.

9. The microphone of claim 7, wherein the retainer, housing, support, and shield collectively form a Faraday cage.

10. The microphone of claim 9, wherein the Faraday cage is formed based on the connection of the retainer to the housing, the contact of the support with the housing, and the engagement of the shield into the contact with the housing.

11. The microphone of claim 1, wherein the housing, support, and shield collectively form a Faraday cage.

12. The microphone of claim 1, wherein the shield is cylindrically shaped having a first open axial end in which the audio transducer and support are passable, and a second closed axial end.

13. The microphone of claim 1, wherein the shield comprises a metallic woven mesh.

14. A microphone comprising:

a frame comprising a biasing member and adapted to support a cartridge;

a conductive shield adapted to at least partially cover the cartridge and to shield the cartridge from electromagnetic radiation; and a housing adapted to house the frame, the cartridge, and the shield, wherein the biasing member is adapted to bias the shield into a contact with an interior surface of the housing.

15. The microphone of claim 14, wherein the frame is adapted to contact the interior surface of the housing.

16. The microphone of claim 14, further comprising a retainer adapted to removably connect to the housing and the frame, and affix the frame within the housing.

17. The microphone of claim 16, wherein the retainer is adapted to bias the frame into an interior of the housing, the biasing of the frame causing the biasing member to engage the shield and bias the shield into the contact with the interior surface of the housing.

18. The microphone of claim 14, wherein the frame comprises a groove adapted to at least partially retain the biasing member.

19. A device comprising:

a frame having a first end and a second end opposite the first end;

a transducer disposed on the first end of the frame;

a biasing member disposed on the frame between the first end and the second end;

an electromagnetic shield adapted to cover the transducer and at least a portion of the first end of the frame; and a housing adapted to house the transducer, the shield, and the first end of the frame, wherein the biasing member is adapted to bias the shield to form an electrical connection between the shield and the housing.

20. The device of claim 19, further comprising a retainer adapted to removably connect to the housing and the second end of the frame to bias the frame into an interior of the housing, the biasing of the frame causing the biasing member to engage the shield and bias the shield into forming the electrical connection between the shield and the housing, wherein the connection of the retainer to the housing and the frame forms electrical connections between the frame, the retainer, and the housing.

* * * * *